US010085359B2

(12) United States Patent
Kurosaki et al.

(10) Patent No.: US 10,085,359 B2
(45) Date of Patent: Sep. 25, 2018

(54) ELECTRIC DEVICE HOUSING RACK AND BATTERY HOUSING SYSTEM

(71) Applicant: Panasonic Intellectual Property Management Co., Ltd., Osaka (JP)

(72) Inventors: Yuta Kurosaki, Osaka (JP); Masashi Morikawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 127 days.

(21) Appl. No.: 14/754,201

(22) Filed: Jun. 29, 2015

(65) Prior Publication Data
US 2016/0021782 A1    Jan. 21, 2016

(30) Foreign Application Priority Data
Jul. 18, 2014    (JP) .................................. 2014-148189

(51) Int. Cl.
*H05K 7/20*    (2006.01)
*H01M 10/613*    (2014.01)
*H01M 10/617*    (2014.01)
*H01M 2/10*    (2006.01)
*H01M 10/6563*    (2014.01)
*H01M 10/627*    (2014.01)
*H01M 10/6566*    (2014.01)
(Continued)

(52) U.S. Cl.
CPC ...... *H05K 7/20145* (2013.01); *H01M 2/1077* (2013.01); *H01M 10/613* (2015.04); *H01M 10/617* (2015.04); *H01M 10/627* (2015.04); *H01M 10/6563* (2015.04); *H01M 10/6566* (2015.04); *H05K 5/0021* (2013.01); *H05K 5/0213* (2013.01)

(58) Field of Classification Search
CPC ............ H05K 7/20145; H01M 10/613; H01M 10/617; H01M 10/627; H01M 10/6563; H01M 10/6566; H01M 2/1077
See application file for complete search history.

(56) References Cited

U.S. PATENT DOCUMENTS

2012/0052358 A1    3/2012    Tan et al.
2014/0057151 A1*   2/2014    Chung ................ B60L 11/1874
                                                            429/120
(Continued)

FOREIGN PATENT DOCUMENTS

CN    101794901    8/2010
DE    3507914      9/1986
(Continued)

OTHER PUBLICATIONS

The Extended European Search Report dated Aug. 31, 2015 for the related European Patent Application No. 15174797.9.
(Continued)

*Primary Examiner* — Jonathan G Jelsma
(74) *Attorney, Agent, or Firm* — Greenblum & Bernstein, P.L.C.

(57) ABSTRACT

In an electric device housing rack, cooling air drawn in by an air inlet from outside of a casing is guided to a first housing and a second housing by a flow divider, and then the cooling air passes through a ventilation opening and inside of a secondary battery module via a heat vent, whereby the secondary battery module is cooled.

20 Claims, 11 Drawing Sheets

(51) Int. Cl.
*H05K 5/00* (2006.01)
*H05K 5/02* (2006.01)

(56) References Cited

U.S. PATENT DOCUMENTS

| | | | |
|---|---|---|---|
| 2014/0072856 A1* | 3/2014 | Chung | H01M 10/5095 |
| | | | 429/120 |
| 2014/0178721 A1* | 6/2014 | Chung | H01M 2/1077 |
| | | | 429/71 |

FOREIGN PATENT DOCUMENTS

| | | |
|---|---|---|
| EP | 20084 | 12/1980 |
| EP | 2693514 | 2/2014 |
| EP | 2704247 | 3/2014 |
| JP | 2004-139724 | 5/2004 |

OTHER PUBLICATIONS

Tsuyoshi Horita et al., "Development of a 100 kWh Energy Storage System using Lithium-ion Battery(1)—Battery Test Results—" Power and Energy Division Convention, No. 348, 2011 (Partial Translation).

* cited by examiner

FIG. 4A
FIG. 4B
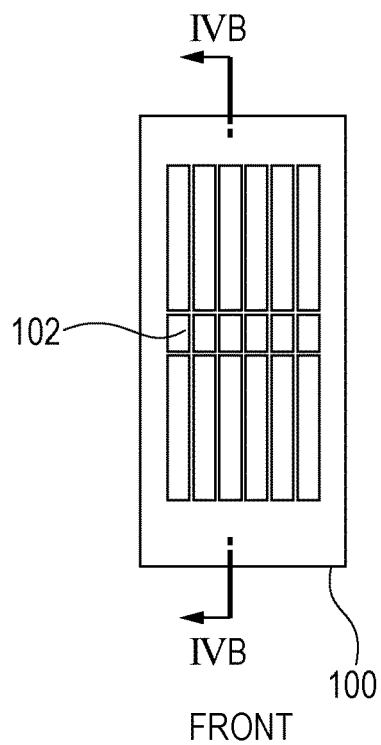
FRONT
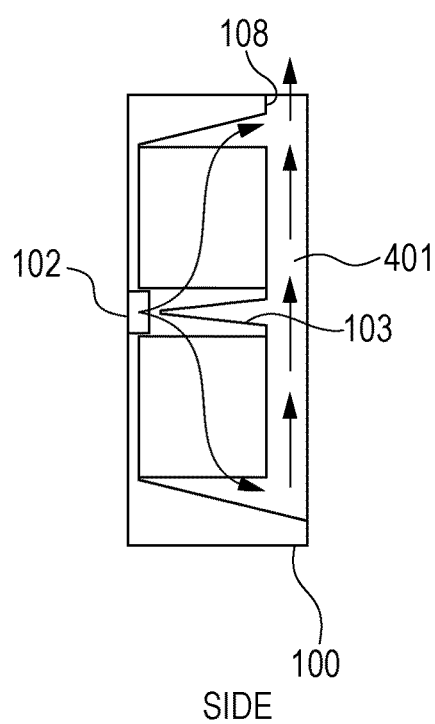
SIDE
FIG. 5
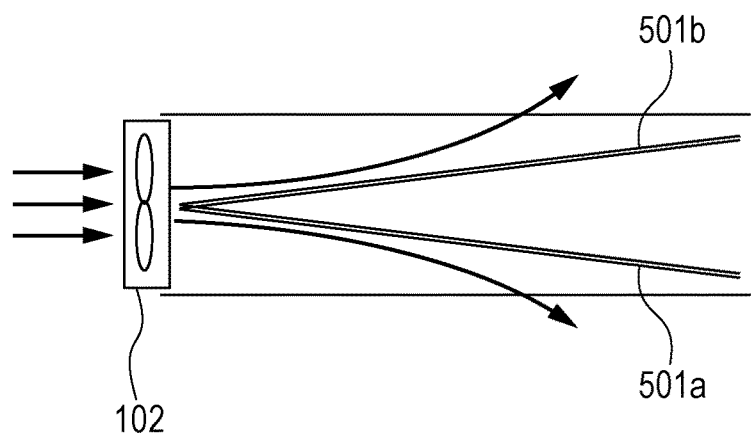

ELECTRIC DEVICE HOUSING RACK AND BATTERY HOUSING SYSTEM

BACKGROUND

1. Technical Field

The present disclosure relates to an electric device housing rack and a battery housing system each configured to house an electric device and cool the electric device housed therein.

2. Description of the Related Art

An electric device that generates heat during use is required to be cooled during use, because continued use of the heated electric device may reduce service life or lead to a deterioration in function. Examples of racks that house and cool electric devices include a server housing rack and a disk array housing rack. Many of these are configured to cool the devices with air.

A disk array apparatus disclosed in Japanese Unexamined Patent Application Publication No. 2004-139724 includes housings adjacent to a front door of a rack and housings adjacent to a rear door of the rack. Each of the housings that houses a disk array includes a fan. Air entering from the front side and air entering from the rear side cools the devices and then passes through a central space of the rack with no mutual interference and is expelled through the top of the rack.

An electricity storage system disclosed in Horita, Yamada, and Matsumoto, "Development of 100 kWh Class Electricity Storage System using Lithium-ion Battery (1)—Test Result Conducted on Batteries—," Power and Energy Division Convention, IEE Japan No. 348, (2010/H23) (hereinafter, referred to as Non-Patent Literature) includes a plurality of secondary battery modules. A cooling fan is provided per pack of three modules in series to cool each of the secondary battery modules by air.

SUMMARY

The above-described conventional techniques do not sufficiently discuss a problem of uneven cooling of electric devices.

One non-limiting and exemplary embodiment provides an electric device housing rack in which uneven cooling of electric devices housed therein is reduced.

In one general aspect, the techniques disclosed here feature an electric device housing rack including a first housing that houses an electric device, a second housing that houses another electric device, an air inlet that is positioned between the first housing and the second housing and that draws air therein, and a flow divider that divides the drawn air into air flowing toward the first housing and air flowing toward the second housing.

It should be noted that general or specific embodiments may be implemented as a system, a method, an integrated circuit, a computer program, a computer readable storage medium such as a CD-ROM, or any selective combination thereof.

According to this embodiment, uneven cooling of the electric devices housed in the electric device housing rack is reduced.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 4A is a front view of the electric device housing rack;

FIG. 4B is a cutaway side view of the electric device housing rack;

FIG. 5 is a cutaway right-side view illustrating a configuration example of a flow divider in the first embodiment;

DETAILED DESCRIPTION

Figure 1:
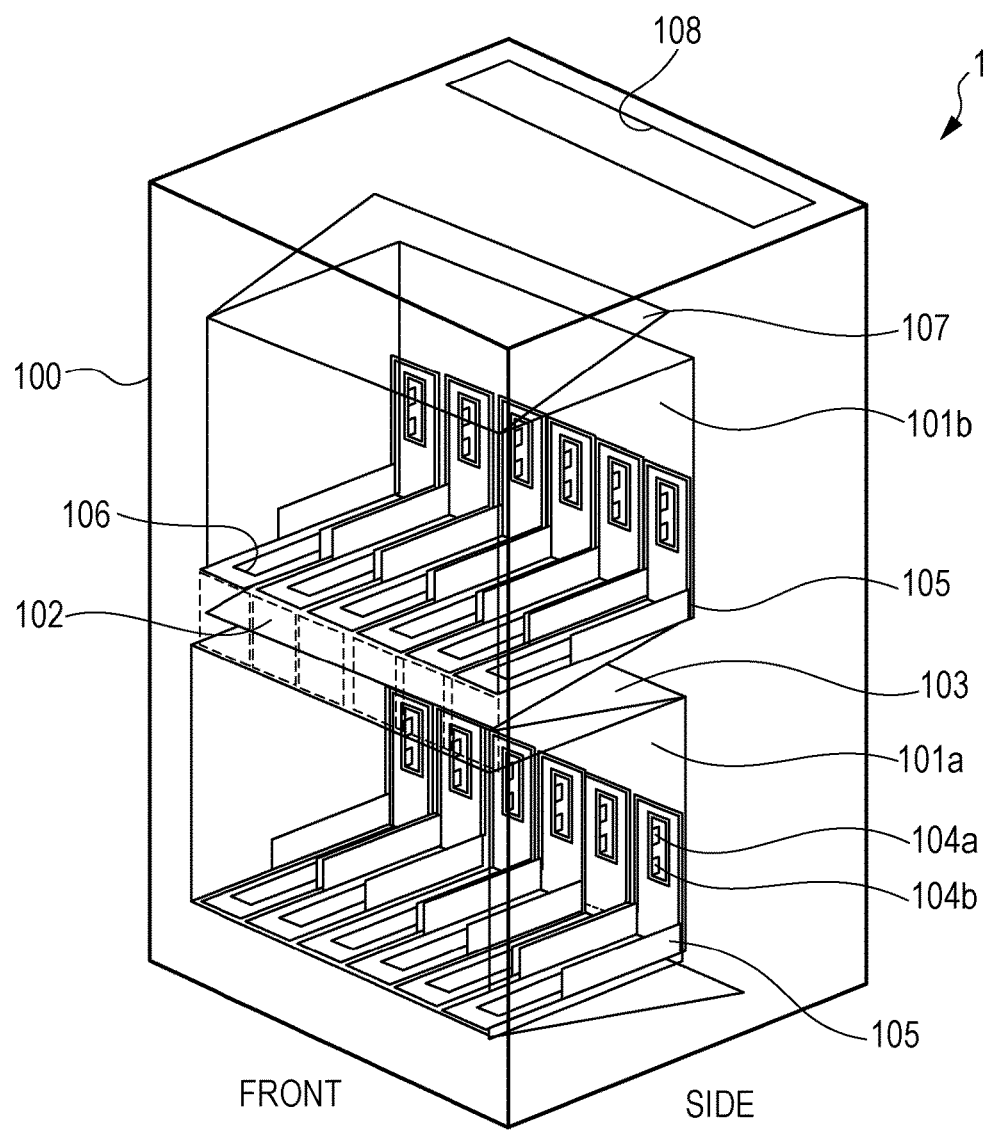
FIG. 1 is a perspective view illustrating a configuration example of an electric device housing rack according to a first embodiment.

The disk array device disclosed in Japanese Unexamined Patent Application Publication No. 2004-139724 includes an air inlet fan for each device housing, and thus the structure of the disk array device cannot be a simple structure to cool electric devices housed therein. In addition, due to the temperature distribution, the higher the position in the disk array device, the higher the temperature of drawn-in air. Thus, uneven cooling of the electric devices housed therein cannot be reduced.

In the electric storage system disclosed in Non-Patent Literature, the cooling fan is provided for each pack of three modules in series, and thus the structure of the electric storage system cannot be a simple structure to cool electric devices housed therein. Furthermore, as indicated in FIG. 3(a) of Non-Patent Literature, the secondary battery modules are unevenly cooled in this electric storage system. The uneven cooling of the electric devices leads to differences in service life and deterioration of function. This lowers reliability of the entire system.

To solve the above-described problems, the inventors of the present disclosure conducted a comprehensive study and found the following findings. An electric device housing rack of a first aspect of the present disclosure includes an electric device housing rack including a first housing that houses an electric device, a second housing that houses another electric device, an air inlet that is positioned between the first housing and the second housing and that draws air therein, and a flow divider that divides the drawn air into air flowing toward the first housing and air flowing toward the second housing.

In the electric device housing rack of a second aspect according to the first aspect, the second housing may be positioned above the first housing, the air inlet may be positioned between the first housing and the second housing in the vertical direction, and the flow divider may divide the drawn air into an upward direction and a downward direction.

In the electric device housing rack of a third aspect according to the second aspect, the flow divider may include a first air guide declined and a second air guide inclined.

With this configuration, drawn-in air can be guided to each of the first housing and the second housing arranged in the vertical direction.

In the electric device housing rack of a fourth aspect according to the third aspect, the first air guide and the second air guide may be connected to each other at a side adjacent to the air inlet.

In the electric device housing rack of a fifth aspect according to any one of the second to fourth aspects, the air inlet may be positioned above a top of the first housing and below a bottom of the second housing.

With this configuration, the drawn-in air can be guided to each of the first housing and the second housing, which are arranged in the vertical direction, in substantially the same amounts.

In the electric device housing rack of a sixth aspect according to the first aspect, the first housing and the second housing may be positioned at the same vertical position, the air inlet may be positioned between the first housing and the second housing, and the flow divider may divide the drawn air into a left direction and a right direction.

In the electric device housing rack of a seventh aspect according to the sixth aspect, the flow divider may include a first air guide angled toward the left and a second air guide angled toward the right.

With this configuration, the drawn-in air can be guided to the first housing and the second housing, which are positioned side by side.

In the electric device housing rack of an eighth aspect according to the seventh aspect, the first air guide and the second air guide may be connected to each other at a side adjacent to the air inlet.

In the electric device housing rack of a ninth aspect according to the seventh or eighth aspect, a distance between the first air guide and the second air guide may be smaller at an upper side than at a lower side.

With this configuration, a larger amount of cooling air can be guided toward the upper side where relatively warm air accumulates.

In the electric device housing rack of a tenth aspect of the present disclosure according to any one of the first to ninth aspects, the air inlet may be an air inlet fan.

In the electric device housing rack of an eleventh aspect according to any one of the first to ninth aspects, the air inlet may be an opening through which air enters.

In the electric device housing rack of a twelfth aspect according to any one of the first to eleventh aspects, the electric device may be a secondary battery module including a secondary battery, the another electric device is the secondary battery module including the secondary battery, the first housing include a first connecting terminal and a second connecting terminal electrically connected to a positive terminal and a negative terminal of the secondary battery module housed therein, and the second housing include the first connecting terminal and the second connecting terminal electrically connected to the positive terminal and the negative terminal of the secondary battery module housed therein.

With this configuration, the secondary battery modules can be charged and discharged while being cooled.

The electric device housing rack of a thirteenth aspect according to the twelfth aspect may further include a casing that houses the first housing and the second housing, an air outlet that expels the drawn air. An exhaust passage through which the air is sent to the air outlet may be defined by the first housing, the second housing, the secondary battery module housed in the first housing, the secondary battery module housed in the second housing, and the casing.

With this configuration, the air after cooling the secondary battery modules can be expelled to the outside, and thus cooling performance is improved and uneven cooling is reduced.

In the electric device housing rack of a fourteenth aspect according to the thirteenth aspect, the first housing and the second housing may be positioned between the air inlet and the air outlet.

With this configuration, the air after cooling the secondary battery modules can be expelled to the outside.

In the electric device housing rack of a fifteenth aspect according to the thirteenth aspect, the first housing and the second housing may each house a short circuit including internal wiring that is electrically connected to the first connecting terminal and the second connecting terminal to provide electrical continuity between the first connecting terminal and the second connecting terminal.

With this configuration, when one of the secondary battery modules is not housed, the other secondary battery modules can be connected in series so as to be in a chargeable and dischargeable state. Therefore, a faulty battery can be readily replaced or the number of batteries to be used can be readily changed without a complex design or a change in design.

In the electric device housing rack of a sixteenth aspect according to the fifteenth aspect, the exhaust passage may be defined by the first housing, the second housing, the secondary battery module housed in the first housing, the secondary battery module housed in the second housing, the short circuit, and the casing.

With this configuration, even if the short circuit is housed, the air after cooling the secondary battery modules can be expelled to the outside.

In the electric device housing rack of a seventeenth aspect according to the sixteenth aspect, the short circuit may have a shape that generates air resistance in the exhaust passage substantially equal to air resistance generated in the exhaust passage by the secondary battery module when housed in the first housing or the second housing.

A battery housing system according to an eighteenth aspect of the present disclosure is a battery housing system including a secondary battery module housing rack and a short circuit. The battery housing system includes a first housing that houses a secondary battery module including a secondary battery, a second housing that houses another secondary battery module, a casing housing the first housing and the second housing, an air inlet positioned between the first housing and the second housing, a flow divider that divides air drawn in by the air inlet into air flowing toward the first housing and air flowing toward the second housing, and an air outlet that expels the air drawn in by the air inlet. The first housing and the second housing each include a first connecting terminal and a second connecting terminal electrically connectable to a positive terminal and a negative terminal, respectively, of the secondary battery module housed therein. The first housing and the second housing each house a short circuit including internal wiring electrically connected to the first connecting terminal and the second connecting terminal to provide electrical continuity between the first connecting terminal and the second connecting terminal. An exhaust passage through which the air is sent to the air outlet is defined by the first housing, the second housing, the secondary battery module housed in the first housing, the secondary battery module housed in the second housing, the short circuit, and the casing.

Hereinafter, embodiments of the present disclosure are described with reference to the drawings.

The embodiments described below provide general or specific examples. Numbers, shapes, components, positions and connection of the components, process steps, and order of the steps described in the following embodiments are examples. The present disclosure is not limited to the embodiments. The components of the following embodiments that are not included in an independent claim, which is the broadest concept of the present disclosure, are optional.

First Embodiment

Hereinafter, a first embodiment is described in detail with reference to FIG. 1 to FIG. 6.

FIG. 1 is a perspective view illustrating a configuration example of an electric housing rack in the first embodiment.

In the first embodiment, the electric device is a secondary battery module including a plurality of secondary battery cells as an assembled battery. However, the secondary battery module is not limited to one including an electric circuit such as a sensing circuit and a protecting circuit or an electric component, and may be one including only the secondary battery cells. Alternatively, the electric device to be housed may be a computer or a network device, for example, which needs to be cooled when housed in the electric housing rack, but should not be limited to these examples.

An electric device housing rack 1 includes a casing 100, a first housing 101a, a second housing 101b, an air inlet 102 positioned between the first housing 101a and the second housing 101b, a flow divider 103, a rectifying plate 107, and an air outlet 108.

The casing 100 includes a door. A user opens the door of the casing 100 and places secondary battery modules 201 (see FIG. 2) in the first housing 101a and the second housing 101b.

Each of the first housing 101a and the second housing 101b includes a plurality of loading holders 105 and the secondary battery module 201 is housed in each of the loading holder 105. The loading holder 105 has a ventilation opening 106 at its bottom. The ventilation opening 106 allows cooling air for cooling the secondary battery module 201 to enter and to be expelled after cooling. The loading holders 105 each include a first connecting terminal 104a and a second connecting terminal 104b electrically connected to the secondary battery module 201. When the secondary battery module 201 is housed in every loading holder 105, the secondary battery modules 201 are all connected in series by the first connecting terminals 104a and the second connecting terminals 104b of the loading holders 105.

In the first embodiment, no partition plate is disposed between the secondary battery modules 201. However, a partition plate may be disposed between devices to be housed to divide space in the first housing 101a and space in the second housing 101b into a plurality of small housings for devices. In addition, although the first housing 101a and the second housing 101b each house the plurality of secondary battery modules 201 in the first embodiment, the first housing 101a and the second housing 101b may each house one secondary battery module 201. In this case, one loading holder 105 may be provided for each of the first housing 101a and the second housing 101b.

In the first embodiment, since the electric device is the secondary battery module 201, the loading holders 105 each include the first connecting terminal 104a and the second connecting terminal 104b electrically connected to the secondary battery module 201. However, the connecting terminals may not be provided when the electric device to be housed is a computer or a network device.

In the first embodiment, the second housing 101b is positioned above the first housing 101a.

The air inlet 102 is positioned between the first housing 101a and the second housing 101b in the vertical direction. Specifically, the air inlet 102 is preferably positioned above the top of the first housing 101a and below the bottom of the second housing 101b. However, the position of the air inlet 102 is not limited to this. The air inlet 102 draws the cooling air outside the casing 100 into the casing 100. The secondary battery modules 201 housed in the first housing 101a and the second housing 101b are cooled by the cooling air drawn in by the air inlet 102.

The air inlet 102 is an air inlet fan in this embodiment. However, if the electric device housing 1 includes a fan in an air passage, the air inlet 102 may be an opening that opens to the outside of the casing 100.

In the first embodiment, the air inlet 102 is positioned away from a mounting surface of the electric device housing rack 1 by a constant distance in the vertical direction. This reduces variation in temperature of the cooling air drawn in by the air inlet 102. The air inlet 102 is positioned away from the mounting surface of the electric device housing rack 1 by a predetermined distance. This reduces the risk that dust on the mounting surface, for example, is drawn with the cooling air. As a result, a decrease in the reliability of the electric device housed in the electric device housing rack 1 is reduced.

The flow divider 103 divides the cooling air drawn in by the air inlet 102 and guides the cooling air to the first housing 101a and the second housing 101b. A specific configuration of the flow divider 103 is described in detail with reference to FIG. 5.

The rectifying plate 107 is disposed below the first housing 101a and/or above the second housing 101b.

The air outlet 108 expels the cooling air drawn from the outside by the air inlet 102 to the outside.

Figure 2A:
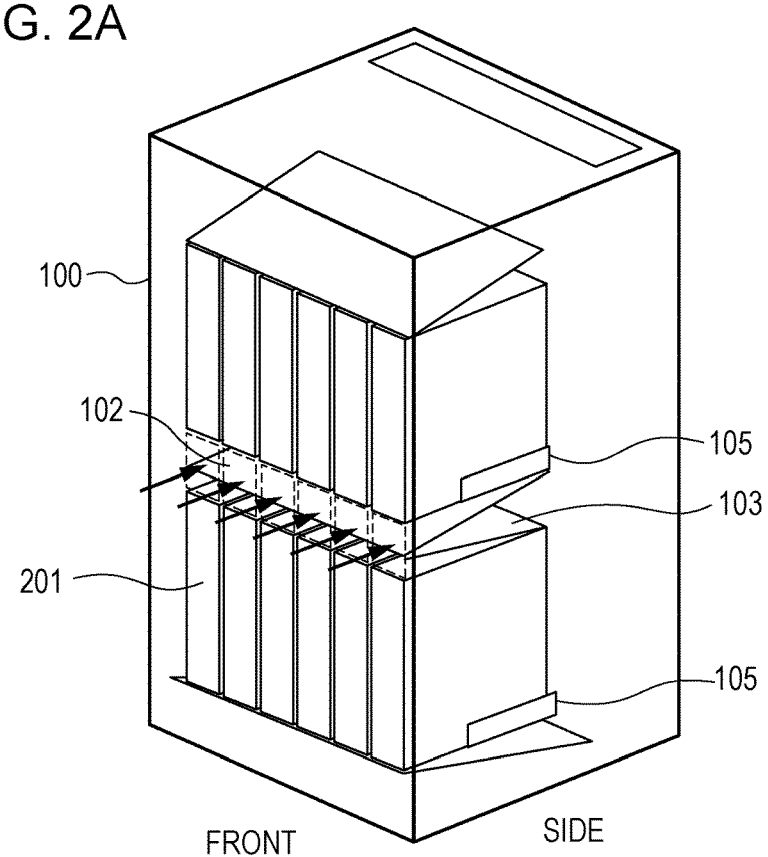
FIG. 2A is a front perspective view of the electric device housing rack in which secondary battery modules are housed.
Figure 2B:
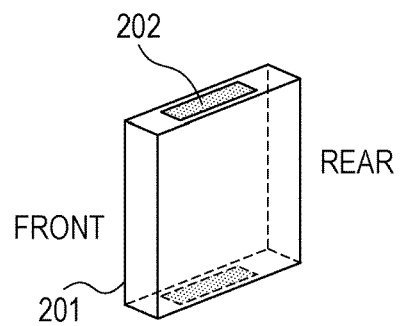
FIG. 2B is a front perspective view of a secondary battery module.
Figure 2C:
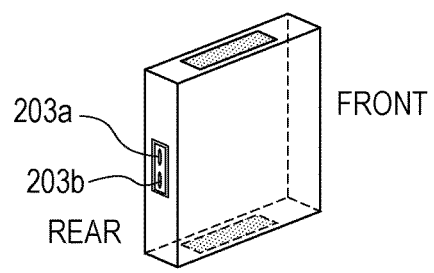
FIG. 2C is a rear perspective view of the secondary battery module.

FIG. 2A is a front perspective view of the electric device housing rack 1 in which the secondary battery modules 201 are housed. FIG. 2B and FIG. 2C are a front perspective view and a rear perspective view, respectively, of the secondary battery module 201.

The secondary battery module 201 includes heat vents 202, a positive terminal 203a, and a negative terminal 203b.

The heat vent 202 is provided in at least one of surfaces of the secondary battery module 201. In the first embodiment, the heat vent 202 is provided in each of an upper surface and a lower surface of the secondary battery module 201, but is not limited to this example. The heat generated during charge and discharge of the secondary battery module 201 is expelled through the heat vents 202 to the outside.

In the first embodiment, the cooling air drawn from the outside of the casing 100 by the air inlet 102 is guided to the first housing 101a and the second housing 101b by the flow divider 103 and passed through the ventilation opening 106 and the inside of the secondary battery modules 201 via the heat vents 202. Thus, the secondary battery modules 201 are cooled.

The positive terminal 203a and the negative terminal 203b are positioned so as to be connected to the first connecting terminal 104a and the second connecting terminal 104b of the loading holder 105 when the secondary battery module 201 is housed in the loading holder 105. In a state illustrated in FIG. 2A, the positive terminal 203a and the negative terminal 203b of each of the secondary battery modules 201 are electrically connected to the first connecting terminal 104a and the second connecting terminal 104b, respectively, of each of the loading holders 105. In this state, all of the secondary battery modules 201 housed in the electric device housing rack 1 are connected in series, and thus all of the secondary battery modules 201 housed in the electric device housing rack 1 are in a chargeable and dischargeable state.

In the first embodiment, the electric device that does not include a cooling function (secondary battery module 201, for example) is housed and cooled. However, the electric device that has a cooling function may be housed and cooled.

The above-described secondary battery module 201 housed therein has the heat vents 202. However, the heat vent 202 is not an optional component in the secondary battery module 201. In addition, the shape of the secondary battery module 201 is not limited to this example.

Figure 3:
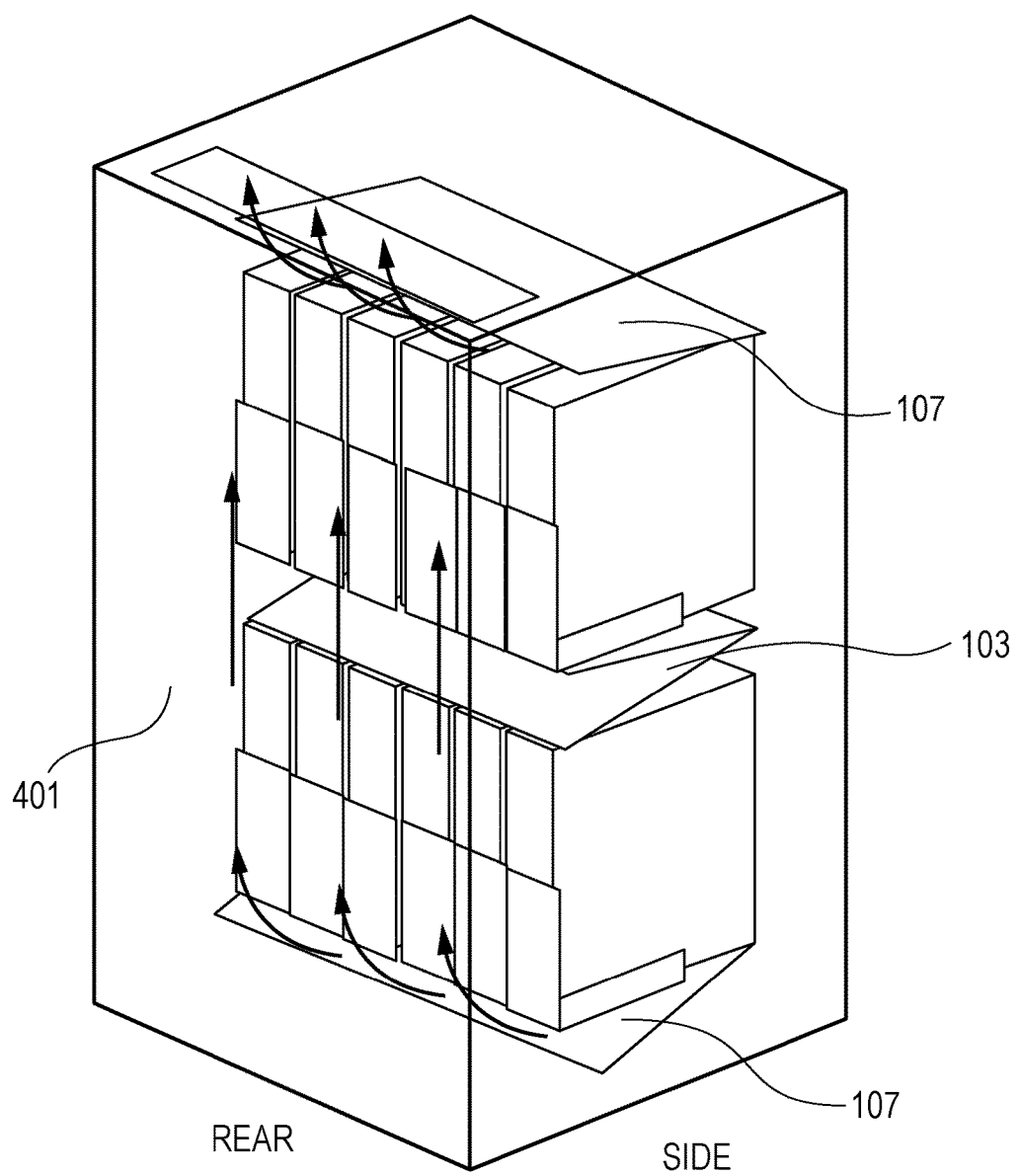
FIG. 3 is a rear perspective view of a rear side of the electric device rack in which the secondary battery modules are housed.

FIG. 3 is a perspective view of a rear side of the electric device housing rack 1 in which the secondary battery modules 201 are housed.

The rectifying plate 107 is disposed below the first housing 101a and/or above the second housing 101b.

The cooling air is drawn in by the air inlet 102 and divided by the flow divider 103 so as to pass through the inside of the secondary battery modules 201 housed in the first housing 101a and the second housing 101b. Then, the cooling air is guided toward the rear side (side adjacent to the surface opposed to the surface having the air inlet 102) of the electric device housing rack 1 by the rectifying plates 107 on upper and lower sides.

The shape or the position of the rectifying plate 107 varies depending on an electric device to be housed and how it is to be housed. The rectifying plate 107 may have any configuration that can guide the cooling air that has cooled the secondary battery modules 201 to the rear side. The shape and the position of the rectifying plate 107 in FIG. 3 are illustrated as examples but are not limited to such examples.

The above-described electric device housing rack 1 includes the rectifying plate 107. However, the rectifying plate 107 is an optional component in the electric device housing rack 1.

FIG. 4A is a front view of the electric device housing rack 1. FIG. 4B is a cutaway side view of the electric device housing rack 1.

Flow of the cooling air drawn in by the air inlet 102 is described with reference to FIGS. 4A and 4B.

The cooling air drawn in by the air inlet 102 is guided toward the first housing 101a and the second housing 101b by the flow divider 103. The cooling air that has passed through the inside of the secondary battery modules 201 housed in the first housing 101a and the second housing 101b is guided toward the rear side of the electric device housing rack 1 by the rectifying plates 107 on the upper and lower sides. Then, the cooling air is expelled to the outside through the air outlet 108.

The cooling air that has passed through the inside of the secondary battery modules 201 is expelled through the air outlet 108 to the outside after flowing along an exhaust passage 401 defined by the casing 100, the first housing 101a, the second housing 101b, and the secondary battery modules 201, which are housed in the first housing 101a and the second housing 101b.

With this configuration, the cooling air that is heated while being used for cooling of the secondary battery modules 201 does not flow to the front side of the electric device housing rack 1, and thus cooling of the secondary battery modules 201 is not prevented by the heated air.

In this embodiment, the exhaust passage 401 is defined by the casing 100, the first housing 101a, the second housing 101b, and the secondary battery modules 201 housed in the first housing 101a and the second housing 101b. However, the exhaust passage 401 is not limited to such a configuration. The electric device housing rack 1 may have an exhaust passage that has a predetermined solid structure (a pipe, for example).

In addition, in the first embodiment, the air outlet 108 is an opening and disposed in the top surface of the electric device housing rack 1. However, the air outlet 108 may be an air outlet fan and is not limited to the examples. The air outlet 108 may be disposed in a rear panel and is not limited to the examples.

The exhaust passage 401 of the electric device housing rack 1 may be directly connected to an exhaust duct of a building where the electric device housing rack 1 is placed such that the air is drawn out through the air outlet 108.

FIG. 5 is a cutaway view illustrating a configuration example of the flow divider 103 in the first embodiment.

The flow divider 103 includes a first air guide 501a declined and a second air guide 501b inclined. The first air guide 501a and the second air guide 501b are connected to each other at a side adjacent to the air inlet 102.

The first air guide 501a that is declined guides the cooling air drawn in by the air inlet 102 to the first housing 101a positioned at the lower side. The second air guide 501b that is inclined guides the cooling air drawn in by the air inlet 102 to the second housing 101b positioned at the upper side of the rack.

With this configuration, the cooling air drawn in by the air inlet 102 is divided into air flowing below the flow divider 103 (first housing 101a side) and air flowing above the flow divider 103 (second housing 101b side), and the cooling air cools the secondary battery modules 201 housed in the first housing 101a and/or the second housing 101b.

In general, cool air falls and warm air rises. Thus, the cooling air drawn in by the air inlet 102 is suitable for cooling the secondary battery modules 201 positioned below the air inlet 102, but is not suitable for cooling the secondary battery modules 201 positioned above the air inlet 102. In the first embodiment, the air inlet 102 is positioned between the first housing 101a and the second housing 101b in the vertical direction, and the flow divider 103 is disposed to divide the air drawn in by the air inlet 102. With this configuration, the uneven cooling of the secondary battery modules 201 housed in the first housing 101a and the second housing 101b is reduced.

In the first embodiment, the first air guide 501a and the second air guide 501b are flat plates having the same shape. The first air guide 501a and the second air guide 501b are symmetrical with respect to the center of the air inlet 102. With this configuration, the flow divider 103 can guide substantially the same amount of the cooling air to the first housing 101a and to the second housing 101b. As a result, uneven cooling of the secondary battery modules 201 is reduced.

Neither the first air guide 501a nor the second air guide 501b is limited to a flat plate and may be a plate having an uneven surface, a curved plate, a single wedge-shaped member, or a side surface of a solid structure. The first air guide 501a and the second air guide 501b are not limited to these examples. In addition, the first air guide 501a and the second air guide 501b are optional in the flow divider 103, and the flow divider 103 may have any configuration that can guide the air drawn in by the air inlet 102 to the first housing 101a and to the second housing 501b.

Figure 6:
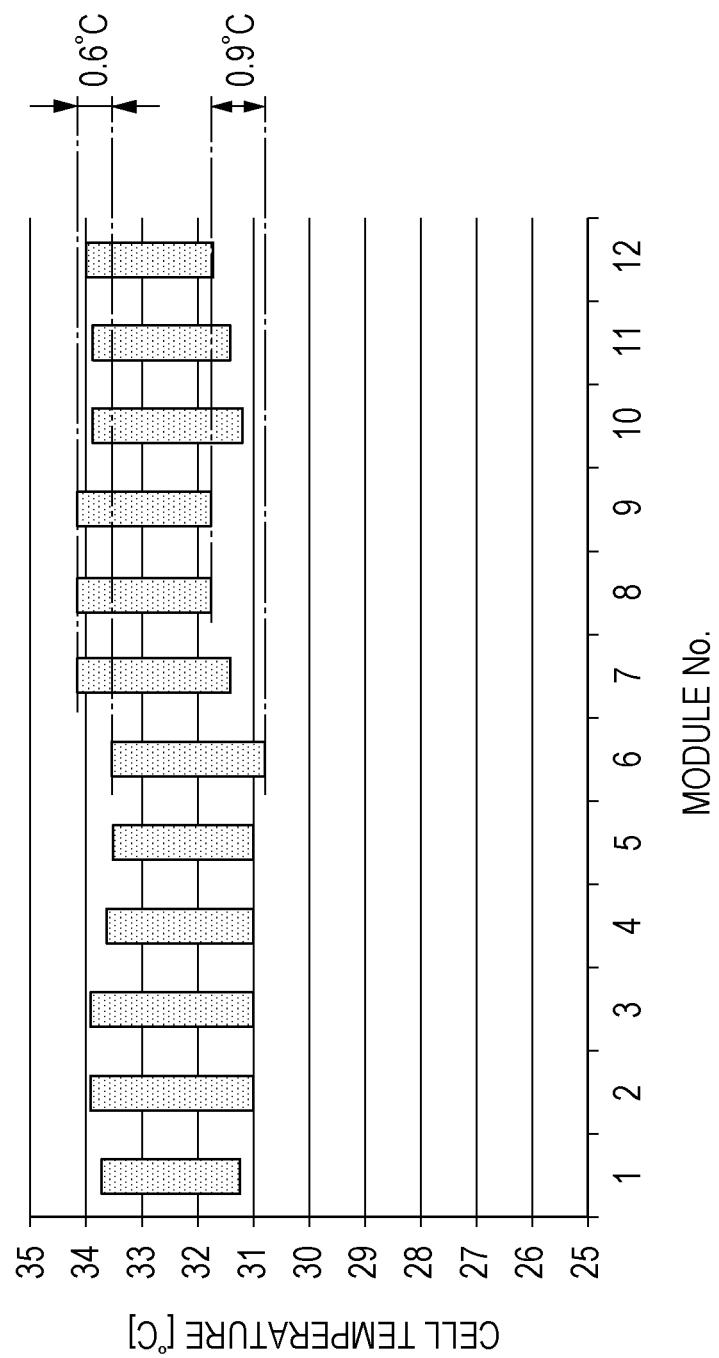
FIG. 6 is a diagram indicating temperature ranges during charge and discharge of the secondary battery modules housed in the electric device housing rack.

FIG. 6 is a diagram indicating temperature ranges in the secondary battery modules 201 that have been charged and discharged in the electric device housing rack 1.

An advantage of this embodiment is described with reference to FIG. 6.

FIG. 6 shows a maximum cell temperature and a minimum cell temperature of each of the secondary battery modules 201, which are housed in the electric device housing rack 1, after 190 minutes from the start of charging and discharging. As can be seen in FIG. 6, the largest difference between the maximum cell temperatures of the secondary battery modules 201 in this embodiment is 0.6° C. and the largest difference between the minimum cell temperatures of the secondary battery modules 201 is 0.9° C. The standard deviation of the maximum cell temperatures is 0.21 and the standard deviation of the minimum cell temperature is 0.30.

Non-Patent Literature reports the results of charge/discharge tests of an electricity storage system that has been developed. FIG. 3(a) in this report shows the maximum cell temperature and the minimum cell temperature of each of 24 battery modules (battery packs). The largest difference between the maximum cell temperatures is a little over 2° C. and the largest difference between the minimum cell temperatures is a little over 5° C. The standard deviation of the maximum cell temperatures is about 0.63 and the standard deviation of the minimum cell temperature is about 1.16.

As is clear from this, in the electric device housing rack 1 according to this aspect, uneven cooling of the electric devices housed in the electric device housing rack 1 is reduced. Therefore, variation in the service life or variation in the deterioration in function of the electric devices is reduced, and a decrease in the reliability of the entire system is reduced.

The electric device housing rack 1 in the first embodiment is described above with reference to FIG. 1 to FIG. 6.

An electric device housing rack of a first aspect includes a first housing that houses an electric device, a second housing that houses another electric device, an air inlet positioned between the first housing and the second housing, and a flow divider that divides air drawn in by the air inlet into air flowing toward the first housing and air flowing toward the second housing. With this configuration, uneven cooling of the electric devices housed in the electric device housing rack is reduced.

Second Embodiment

In the electric device housing rack 1 in the first embodiment, the secondary battery modules 201 that are housed in the upper and lower housings are cooled. An electric device housing rack 2 in a second embodiment differs from the electric device housing rack 1 of the first embodiment in that the secondary battery modules 201 that are housed in left and right housings are cooled.

Hereinafter, the second embodiment is described in detail with reference to FIG. 7A to 7C. The components in the second embodiment that are the same as those in the first embodiment are assigned the same reference numerals as those in the first embodiment, and description thereof is omitted.

Figure 7A:
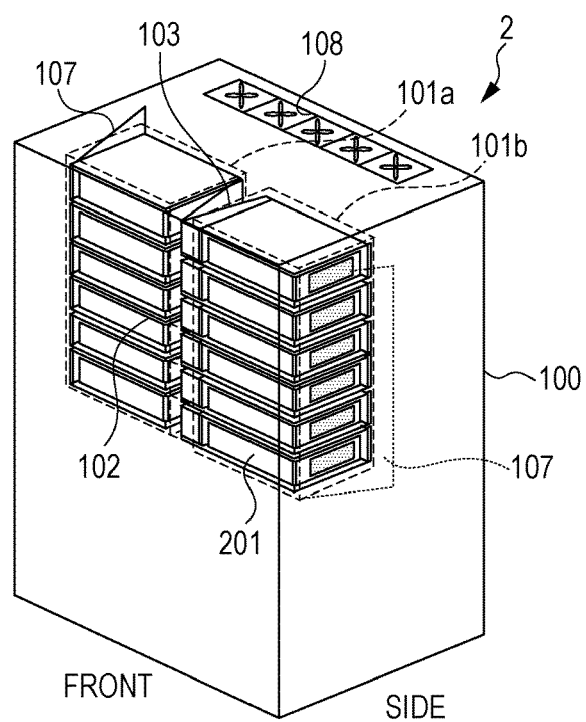
FIG. 7A is a perspective view illustrating a configuration example of the electric device housing rack in a second embodiment.
Figure 7B:
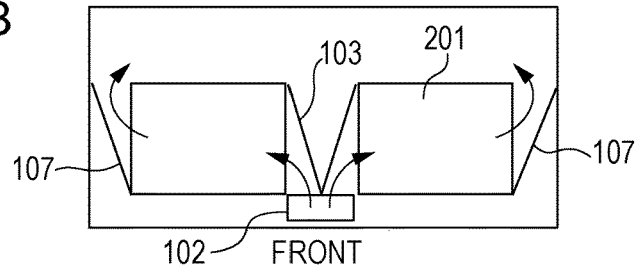
FIG. 7B is a cutaway top view illustrating a configuration example of the electric device housing rack in the second embodiment.
Figure 7C:
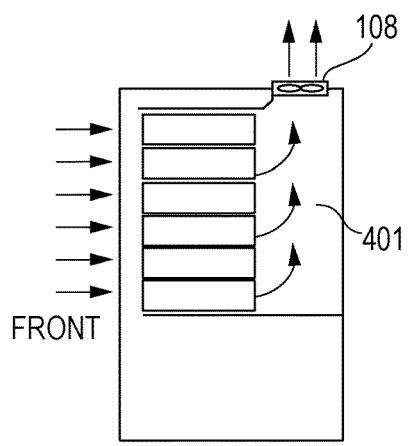
FIG. 7C is a cutaway right-side view illustrating a configuration example of the electric device housing rack in the second embodiment.

FIG. 7A, FIG. 7B, and FIG. 7C are a perspective view, a cutaway top view, and a cutaway right-side view, respectively, of a configuration example of an electric device housing rack 2 in the second embodiment. The electric device housing rack 2 in the second embodiment includes a first housing 101a and a second housing 101b that are positioned at the same vertical position. The electric device housing rack 2 houses the secondary battery modules 201 arranged in a vertical direction and cools the secondary battery modules 201.

The air inlet 102 is positioned such that the air inlet 102 is positioned between the first housing 101a and the second housing 101b in a front view of the electric device housing rack 2. In other words, the air inlet 102 may not actually be disposed between the first housing 101a and the second housing 101b, and may be positioned on a door of the electric device housing rack 2 at a position corresponding to the position between the first housing 101a and the second housing 101b.

The flow divider 103 is positioned behind the air inlet 102. The flow divider 103 divides the cooling air drawn in by the air inlet 102 into left and right air flows and guides the divided air to the first housing 101a and the second housing 101b. In the second embodiment, the flow divider 103 includes a first air guide 501a angled toward the left and a second air guide 501b angled toward the right when viewed from a front side in which the air inlet 102 is positioned. A specific configuration of the flow divider 103 is described in detail with reference to FIG. 8A and FIG. 8B.

As in the electric device housing rack 1 in the first embodiment, the electric device housing rack 2 in the second embodiment includes a rectifying plate 107. In the second embodiment, the rectifying plate 107 is disposed on the left of the first housing 101a and on the right of the second housing 101b. However, the position of the rectifying plate 107 is not limited to this example, and, as in the first embodiment, the rectifying plate 107 is not an essential component.

The cooling air drawn in by the air inlet 102 and divided by the flow divider 103 passes through the second battery modules 201. Then, the cooling air is guided by the rectifying plate 107 to the rear side of the rack and expelled through the air outlet 108 via the exhaust passage 401. In the second embodiment, the air outlet 108 is an exhaust fan. However, as in the first embodiment, the air outlet 108 is not limited to this example.

Figure 8A:
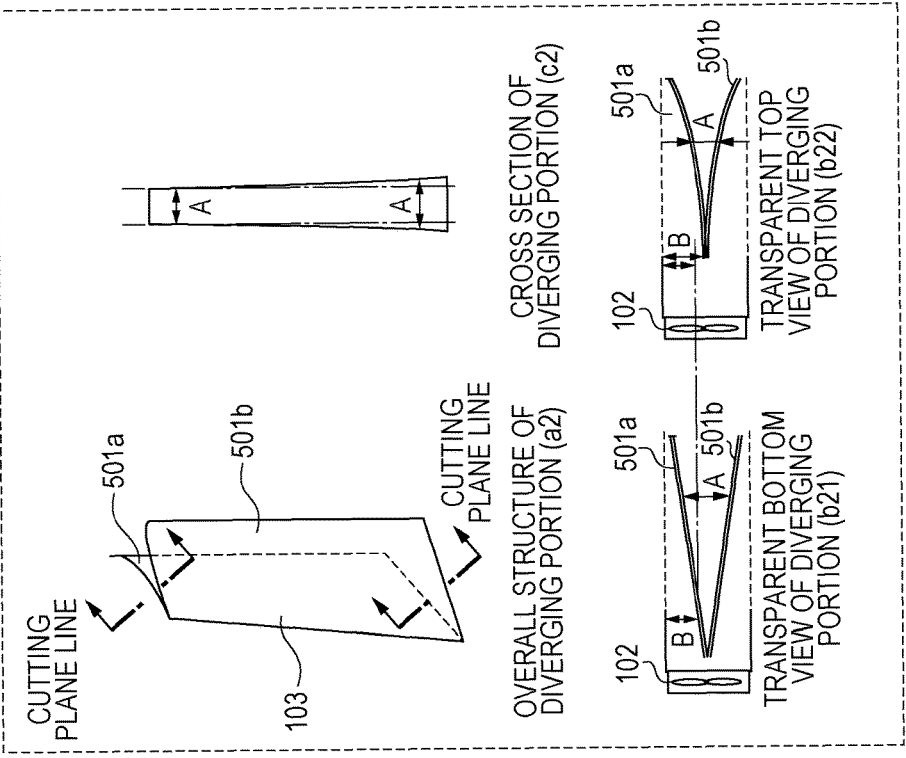
FIG. 8A includes a perspective view, a cross-sectional view, a cutaway top view, and a cutaway bottom view illustrating a configuration example of a flow divider of the electric device housing rack in the second embodiment.
Figure 8B:
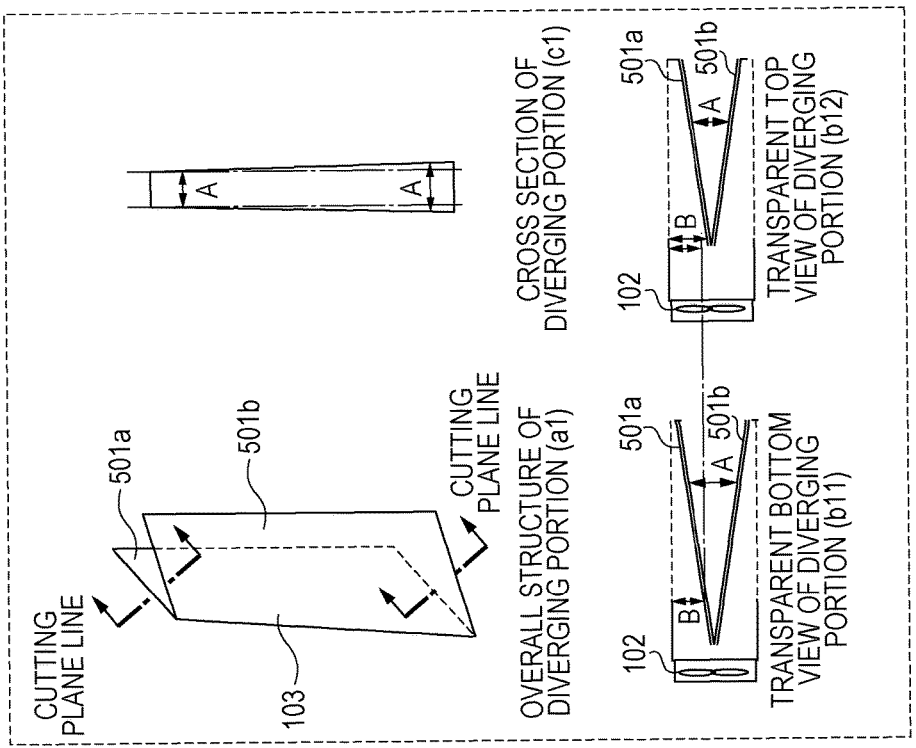
FIG. 8B includes a perspective view, a cross-sectional view, a cutaway top view, and a cutaway bottom view illustrating a configuration example of a flow divider of the electric device housing rack in the second embodiment.

FIGS. 8A and 8B each include a perspective view, a cross-sectional view, a cutaway top view, and a cutaway bottom view illustrating configuration examples of the flow divider 103 of the electric device housing rack 2 in the second embodiment.

The flow divider 103 in the second embodiment illustrated in (a1), (b11), (b12), and (c1) of FIG. 8A includes the first air guide 501a angled toward the left and the second air guide 501b angled toward the right. The first air guide 501a and the second air guide 501b are connected to each other at a side adjacent to the air inlet 102. The first air guide 501a, which is angled to the left, guides the cooling air drawn in by the air inlet 102 to the left toward the first housing 101a. The second air guide 501b, which is angled to the right, guides the cooling air drawn in by the air inlet 102 to the right toward the second housing 101b.

In the second embodiment, since the air inlet 102 extends in the vertical direction, the higher the position in the air inlet 102, the higher the temperature of the cooling air drawn in by the air inlet 102 due to the temperature distribution. Therefore, in order to reduce uneven cooling of the electric devices housed in the electric device housing rack 2, a larger amount of cooling air is required to be applied to the electric devices on the upper side than the electric devices on the lower side.

In the flow divider 103 in the second embodiment, a distance between the first air guide 501a and the second air guide 501b is smaller at an upper side than at a lower side. In other words, in a cross-sectional shape of the flow divider 103 that is taken along a plane parallel to a front surface of the casing 100, a distance A between a cutting plane line of the first air guide 501a and a cutting plane line of the second air guide 501b is smaller at the upper side than at the lower side. With this configuration, an air passage B relative to the air inlet 102 is wider at the upper side of the flow divider 103 than at the lower side. Therefore, a larger amount of cooling air is applied to the electric devices mounted at the upper side of the rack, thereby reducing the uneven cooling caused by uneven temperature of the drawn-in air.

In FIG. 8A, (a1), (b11), (b12), and (c1) illustrate the flow divider 103 including flat plates as the first air guide 501a and the second air guide 501b. However, as illustrated in (a2), (b21), (b22), and (c2) of FIG. 8B, the flow divider 103 may include curved plates as the first air guide 501a and the second air guide 501b that are connected to have a connection angle decreasing toward the top.

In addition, the structure of the flow divider 103 may not be different at the upper side and the lower side. A variable-speed fan may be used as the air inlet fan such that the amount of air increases toward the top to reduce the uneven cooling.

The distance between the first air guide 501a and the second air guide 501b may not be smaller at the upper side than at the lower side, which is illustrated in FIG. 8A and FIG. 8B. It should be noted that the advantage of the present embodiment can be obtained by a configuration in which the first air guide 501a and the second air guide 501b are spaced apart from each other at a constant distance.

The electric device housing rack 2 in the second embodiment is described above with reference to FIGS. 7A to 7C and FIGS. 8A and 8B.

The electric device housing rack 2 in the second embodiment houses the secondary battery modules 201 in the left and right housings and cools the secondary battery modules 201. With this configuration, when the electric devices are housed in the left and right housings, the uneven cooling of the electric devices is reduced.

Third Embodiment

The electric device housing rack 1 in the first embodiment and the electric device housing rack 2 in the second embodiment are racks that are configured to cool the secondary battery modules 201 and connect the secondary battery modules 201 in series when the secondary battery modules 201 are housed therein.

However, in the electric device housing rack 1 or the electric device housing rack 2, if the secondary battery module 201 is not mounted to any one of the loading holders 105, all of the secondary battery modules 201 cannot be connected in series. Thus, all of the secondary battery modules 201 cannot be charged and discharged. In such a case, a change in the structure of the wiring connection in the rack is usually required. If one or more of the secondary battery modules 201 cannot be used by accident, a change in the wiring connection is required, or a time is required until an alternative secondary battery module 201 is delivered. Thus, the electric device housing rack 1 or the electric device housing rack 2 cannot be brought back to a chargeable and dischargeable state in a short time. In addition, if one or more of the secondary battery modules 201 are removed for inspection or maintenance of the secondary battery modules 201, the remaining secondary battery modules 201 cannot be charged and discharged. In addition, if the number of secondary battery modules 201 is variable so as to make the entire capacity of the electric device housing rack 1 or the electric device housing rack 2 variable, an additional work such as a change in wiring is required. The entire capacity cannot be readily changed.

In order to solve the above-described problems, in an electric device housing rack 3 in the third embodiment, a short circuit is housed in the loading holder 105 in which the secondary battery module 201 is not mounted.

Hereinafter, the third embodiment is described with reference to FIG. 9A to FIG. 12B. The components in the third embodiment that are the same as those in the first embodiment or the second embodiments are assigned the same reference numerals as those in the first embodiment or the second embodiment, and description thereof is omitted.

Hereinafter, the short circuit used in the third embodiment is described in detail with reference to FIG. 9A and FIG. 9B.

Figure 9A:
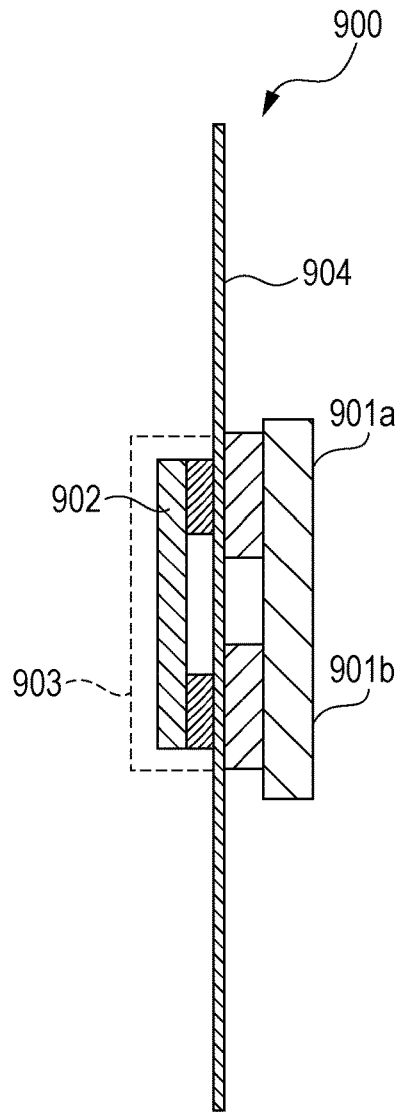
FIG. 9A is a cutaway side view illustrating a configuration example of a short circuit housed in the electric device housing rack in the first embodiment or the second embodiment.
Figure 9B:
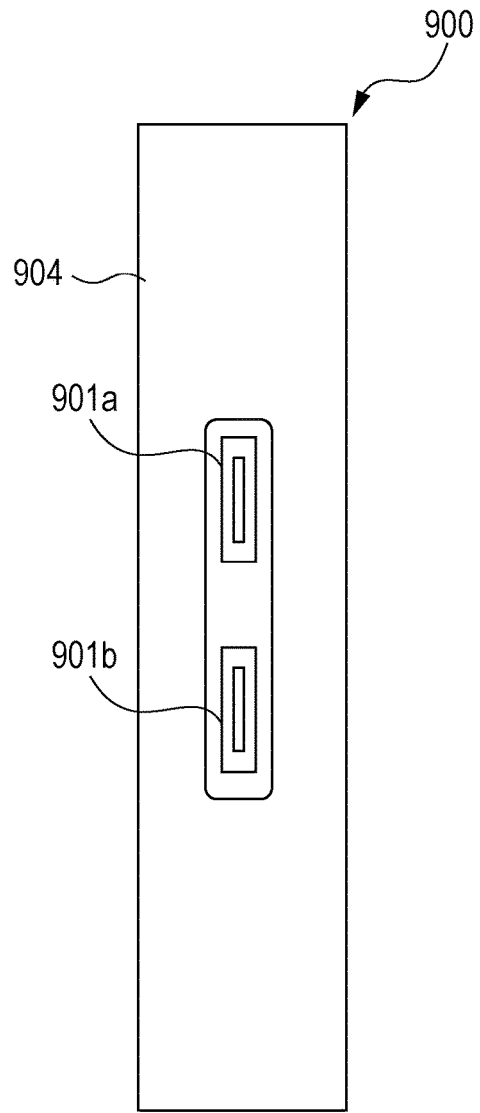
FIG. 9B is a front view illustrating a configuration example of a short circuit housed in the electric device housing rack in the first embodiment or the second embodiment.

FIG. 9A and FIG. 9B are a cutaway side view and a front view, respectively, of a configuration example of a short circuit 900 housed in the electric device housing rack 1 or 2 in the first embodiment or the second embodiment.

The short circuit 900 includes a first connecting terminal 901a, a second connecting terminal 901b, internal wiring 902, an electric shock prevention insulation cover 903 covering the internal wiring 902, and a wind shielding plate 904.

The first connecting terminal 901a and the second connecting terminal 901b have the same shapes as the positive terminal 203a and the negative terminal 203b of the second battery module 201, and thus the short circuit 900 is connectable to the first connecting terminal 104a and the second connecting terminal 104b of the electric device housing rack 3 in the same manner as the secondary battery module 201.

The first connecting terminal 901a and the second connecting terminal 901b may be crocodile clips or may have any shapes that can establish electrical connection by clamping a conducting body of the respective first connecting terminal 104a and the second connecting terminal 104b of the rack, for example.

The internal wiring 902 electrically connects the first connecting terminal 901a and the second connecting terminal 901b. When the short circuit 900 is housed in the loading holder 105 of the electric device housing rack 3, the internal wiring 902 electrically connects the first connecting terminal 104a and the second connecting terminal 104b of the loading holder 105 and causes a short circuit.

The internal wiring 902 may be a bus bar that is made of a low resistance conductor or may be an ordinary cable. In addition, a fuse or a PTC thermistor may be included in the internal wiring 902 to protect the secondary battery modules 201 from excessive current. The internal wiring 902 may include a switch, a mechanical relay, or a semiconductor switching element, for example, which can be electrically opened or closed through a predetermined external operation. The internal wiring 902 is not limited to such examples and may be any device that can electrically connect the first connecting terminal 901a and the second connecting terminal 901b with the first connecting terminal 104a and the second connecting terminal 104b, respectively.

The short circuit 900 in the third embodiment is configured to establish electrical connection in the open circuit and to prevent backflow of exhaust air, which will be described later. In addition, the short circuit 900 may be configured to inform a measured value (or a calculation result obtained by the measured result) or an abnormality detection to the outside by including a current sensing circuit and wire/wireless communication circuit in the internal wiring 902.

The electric shock prevention insulation cover 903 covers the internal wiring 902 so as not to be exposed to the outside and protects workers from electric shock during attachment of the short circuit 900. The electric shock prevention insulation cover 903 is optional if safety of the workers during attachment of the short circuit 900 can be secured by another means (by insulating gloves, or by removal of all of the secondary battery modules 201 for attachment operation of the short circuit 900, for example).

The wind shielding plate 904 is a plate having substantially the same shape and the same size as the surface of the secondary battery module 201 that has the positive terminal 203a and the negative terminal 203b. The wind shielding plate 904 prevents backflow of the cooling air flowing in the exhaust passage 401 after cooling of the secondary battery module 201. The wind shielding plate 904 may be integral with the short circuit 900, or may be detachable. In addition, the wind shielding plate 904 is not limited to a flat plate and may have any shape that creates substantially the same air resistance in the exhaust passage 401 as the air resistance generated in the exhaust passage 401 by the secondary battery module 201. The wind shielding plate 904 may have a solid shape substantially the same as the shape of the casing of the secondary battery module 201.

The function and the advantage of the wind shielding plate 904 are described with reference to FIG. 10 to FIG. 12B.

Figure 10A:
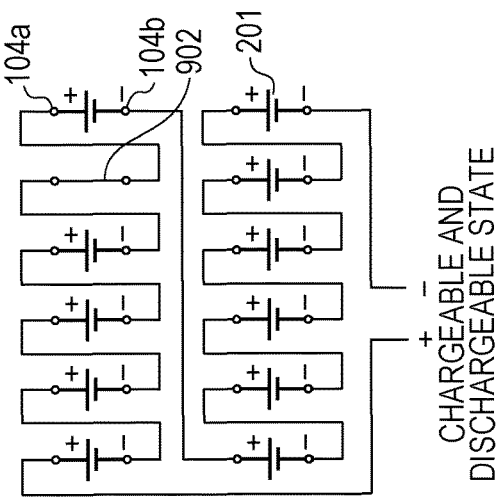
FIGS. 10A, 10B, and 10C are diagrams indicating configuration examples of electrical connection of the secondary battery modules and the short circuit.
Figure 10B:
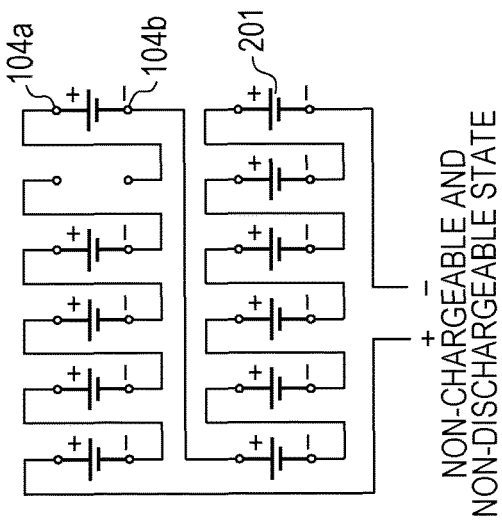
Figure 10C:
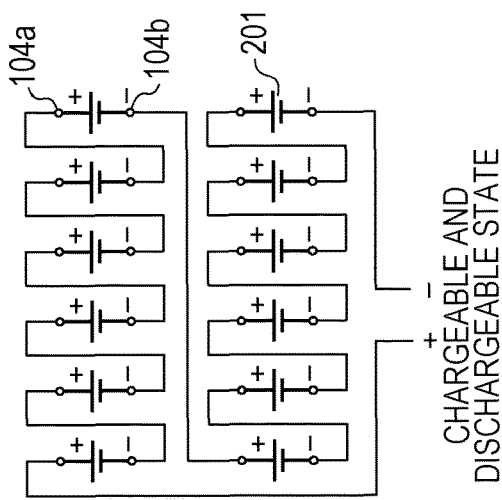

FIG. 10A to FIG. 10C illustrates a configuration example of electric connection between the secondary battery modules 201 and the short circuit 900 housed in the electric device housing rack 3.

FIG. 10A illustrates a state in which all the secondary battery modules 201 are housed. In this state, the secondary battery modules 201 are all connected in series, and the secondary battery modules 201 are in a chargeable and dischargeable state in the electric device housing rack 3.

FIG. 10B illustrates a state in which one of the secondary battery modules 201 is not housed. In this state, the electric circuit in the electric device housing rack 3 is partially open, and the electric device housing rack 3 cannot charge and discharge using the secondary battery modules 201 unless the internal wiring connection is changed.

FIG. 10C illustrates a state in which the short circuit 900 is disposed at a position where the secondary battery module 201 is not housed in the electric device housing rack 3. In this state, the electric circuit that is open in FIG. 10B is short-circuited by the internal wiring 902 of the short circuit 900. With this configuration, in the electric device housing rack 3, the secondary battery modules 201 can be charged and discharged without a change in the internal wiring connection. As a result, the charge and discharge can be continued even if one or more of the secondary battery modules 201 cannot be used due to unexpected abnormality, or even when one or more of the secondary battery modules 201 are removed for inspection or maintenance of the secondary battery modules 201. In addition, without any special work such as a change in wiring, an overall capacity can be readily changed.

Figure 11:
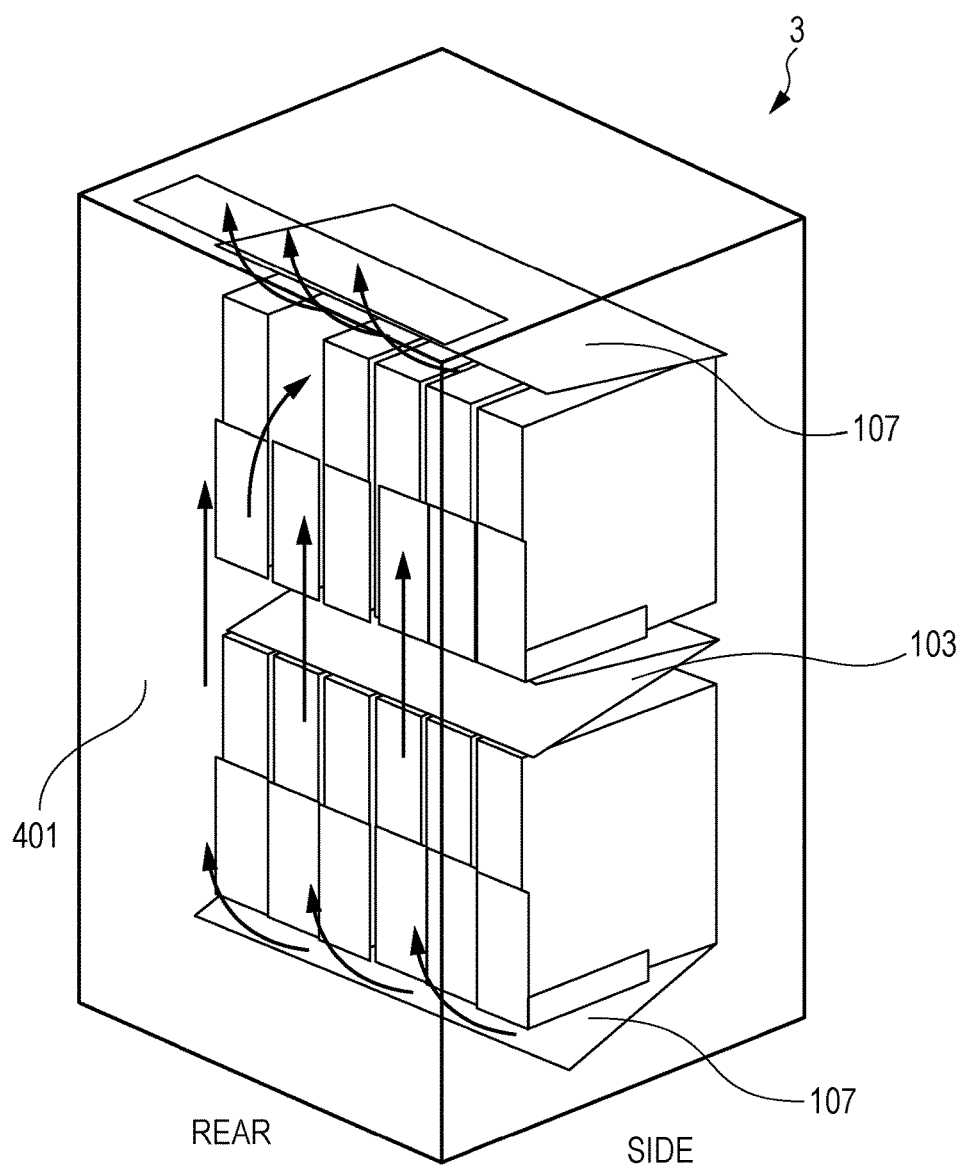
FIG. 11 is a view illustrating flow of cooling air in the electric device housing rack in which one of the secondary battery modules is not housed.

FIG. 11 illustrates flow of cooling air in the electric device housing rack 3 in which one of the secondary battery modules 201 is not housed in the housing.

The exhaust passage 401 of the electric device housing rack 3 is defined by the casing 100, the first housing 101a, the second housing 101b, and the secondary battery modules 201 housed in the first housing 101a and the second housing 101b. Thus, if there is a space without the secondary battery module 201, as illustrated in FIG. 11, the cooling air after cooling the secondary battery modules 201 flows toward the housing 101. This reduces cooling performance and increases unevenness of cooling.

Figure 12A:
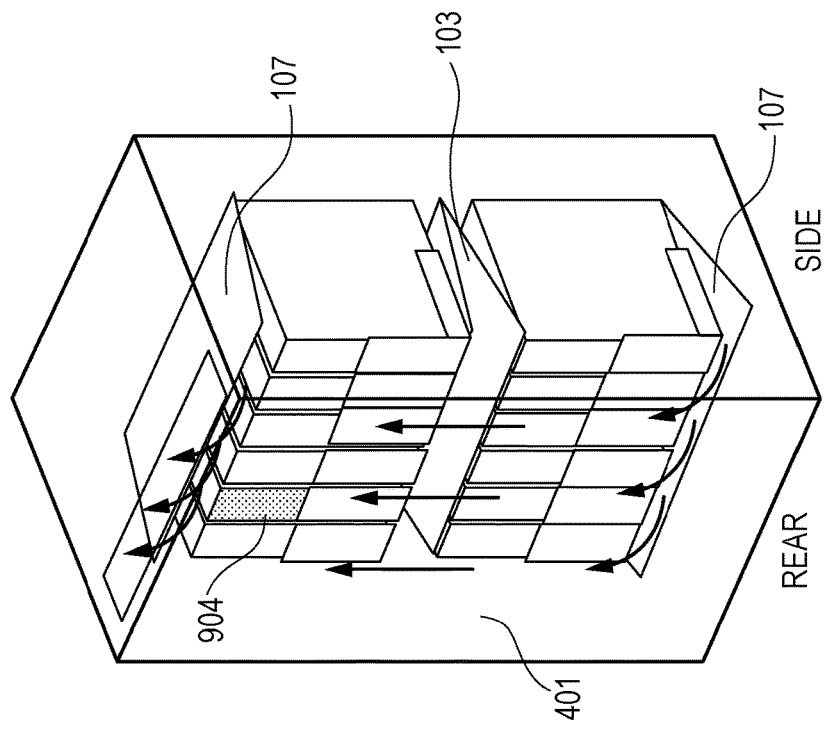
FIG. 12A is a front perspective view illustrating the electric device housing rack in which the short circuit is housed and indicating flow of cooling air.
Figure 12B:
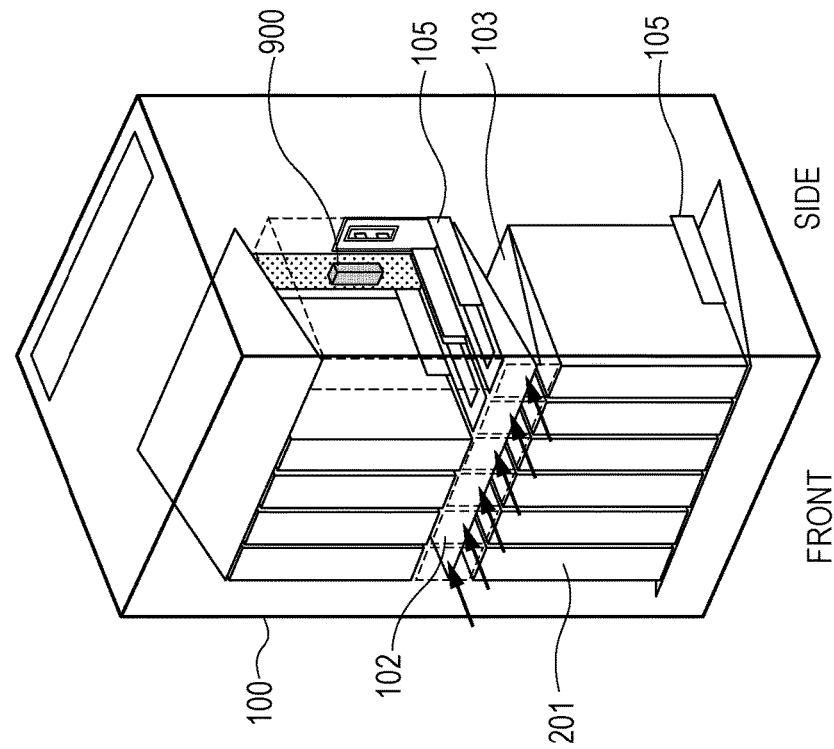
FIG. 12B is a rear perspective view illustrating the electric device housing rack in which the short circuit is housed and indicating flow of cooling air.

FIG. 12A is a front perspective view illustrating the electric device housing rack 3 in which the short circuit 900 is housed. FIG. 12B is a rear perspective view illustrating the electric device housing rack 3 in which the short circuit 900 is housed and indicating flow of cooling air.

In FIG. 12A, the short circuit 900 causes a short circuit between the first connecting terminal 104a and the second connecting terminal 104b of the loading holder 105. In such a case, the wind shielding plate 904 defines a part of the exhaust passage 401 instead of the casing of the secondary battery module 201 that is not housed.

With this configuration, as illustrated in FIG. 12B, even if one or more of the secondary battery modules 201 are not housed, the cooling air after cooling is prevented from flowing toward the housing 101, and thus the cooling performance is not reduced and the cooling unevenness.

The electric device housing rack 3 in the third embodiment is described above with reference to FIGS. 9A and 9B to FIGS. 12A and 12B.

The short circuit 900 in the third embodiment is housed in a part of the electric device housing rack 3 where one of the secondary battery modules 201 is not disposed, and thus the electric circuit that is open is closed. Thus, the secondary battery modules 201 are in a chargeable and dischargeable state although the wiring connection inside the electric device housing rack 3 is not changed. In addition, the wind shielding plate 904 generates the air resistance in the exhaust passage 401 substantially equal to the air resistance generated by the secondary battery module 201, and thus the cooling air after cooling is prevented from flowing toward the housing, whereby the reduction in the cooling performance and an increase in the unevenness of cooling are prevented.

The electricity storage system according to one or more aspects is described above based on the embodiments, but the present disclosure should not be limited thereto. Various changes added to the embodiments by a person skilled in the art, and combinations of the components in different embodiments may be within the scope of one or aspects.

The electric device housing rack according to this disclosure is applicable to an electric device housing rack that cools an electric device housed therein, and more particularly to an electric device housing rack that houses an electric device having a service life or properties (performance) that easily affected by temperature changes.

What is claimed is:

1. An electric device housing rack comprising:
   a first housing that houses a first array of electric devices;
   a second housing that houses a second array of electric devices;
   an air inlet that is positioned in a space between the first housing and the second housing, and that draws air between the first housing and the second housing in a direction transverse to a direction in which the first and second arrays of electric devices extend, a flow direction of the air drawn through the air inlet and the direction transverse are parallel to at least one of a first surface of the first housing, that is adjacent to the second housing and a first surface of the second housing, that is adjacent to the first housing;
   a flow divider that divides the drawn air into air flowing toward the first housing and air flowing toward the second housing,
   an air outlet at an upper rear of the housing rack, which is provided in a surface transverse to a front surface in which the air inlet is provided and through which air that passed through each of the first housing and the second housing is exhausted from the housing rack, and
   first and second rectifying plates that direct the air, that has passed through the electric devices of the first and second housings, towards the air outlet, the first rectifying plate extending along a second surface of the first housing opposite the first surface of the first housing at which the flow divider is provided, the second rectifying plate extending along a second surface of the second housing opposite the first surface of the second housing at which the flow divider is provided, a distance between the first and second rectifying plates increasing from the front surface in which the air inlet is provided toward a rear surface opposite the front surface.

2. The electric device housing rack according to claim 1, wherein
   the second housing is positioned above the first housing,
   the air inlet is positioned between the first housing and the second housing in a vertical direction, and
   the flow divider divides the drawn air into an upwardly directed flow and a downwardly directed flow.

3. The electric device housing rack according to claim 2, wherein the flow divider includes a first air guide that declines with respect to horizontal and a second air guide that inclines with respect to horizontal.

4. The electric device housing rack according to claim 3, wherein the first air guide and the second air guide are connected to each other at a side adjacent to the air inlet.

5. The electric device housing rack according to claim 2, wherein the air inlet is positioned above a top of the first housing and below a bottom of the second housing.

6. The electric device housing rack according to claim 1, wherein
   the first housing and the second housing are positioned at the same vertical position,
   the air inlet is positioned between the first housing and the second housing, and
   the flow divider divides the drawn air into a leftwardly directed flow and a rightwardly directed flow.

7. The electric device housing rack according to claim 6, wherein the flow divider includes a first air guide angled leftwardly and a second air guide angled rightwardly.

8. The electric device housing rack according to claim 7, wherein the first air guide and the second air guide are connected to each other at a side adjacent to the air inlet.

9. The electric device housing rack according to claim 7, wherein a distance between the first air guide and the second air guide is smaller at an upper side than at a lower side.

10. The electric device housing rack according to claim 1, wherein the air inlet is an air inlet fan.

11. The electric device housing rack according to claim 1, wherein the air inlet is an opening through which air enters.

12. The electric device housing rack according to claim 1, wherein
   the first electric device is a first secondary battery module including a first secondary battery,
   the second electric device is a second secondary battery module including a second secondary battery,
   the first housing include a first connecting terminal and a second connecting terminal electrically connected to a positive terminal and a negative terminal of the first secondary battery module housed therein, and
   the second housing include the first connecting terminal and the second connecting terminal electrically connected to the positive terminal and the negative terminal of the second secondary battery module housed therein.

13. The electric device housing rack according to claim 12, further comprising:
   a casing that houses the first housing and the second housing; and
   an exhaust passage through which air is directed to the air outlet is defined by the first housing, the second housing, the secondary battery module housed in the first housing, the secondary battery module housed in the second housing, and the casing.

14. The electric device housing rack according to claim 13, wherein the first housing and the second housing are positioned between the air inlet and the air outlet.

15. The electric device housing rack according to claim 13, wherein the first housing and the second housing each house a short circuit including internal wiring that is electrically connected to the first connecting terminal and the second connecting terminal to provide electrical continuity between the first connecting terminal and the second connecting terminal.

16. The electric device housing rack according to claim 15, wherein the exhaust passage is defined by the first housing, the second housing, the secondary battery module housed in the first housing, the secondary battery module housed in the second housing, the short circuit, and the casing.

17. The electric device housing rack according to claim 16, wherein the short circuit has a shape that generates air resistance in the exhaust passage substantially equal to air resistance generated in the exhaust passage by the secondary battery module when housed in the first housing or the second housing.

18. The electric device housing rack according to claim 1, wherein the flow divider is inclined in the direction transverse to the direction in which the first electric devices and the second electric devices are arrayed.

19. The electric device housing rack according to claim 1, wherein the flow divider divides the airflow flowing from a front to a back of the first and second electric devices into discrete streams.

20. The electric device housing rack according to claim 1, wherein heat transfer between the electric devices and the air drawn through the air inlet takes place while the air is flowing in the transverse direction.

* * * * *